(12) United States Patent
Ahn et al.

(10) Patent No.: US 7,511,326 B2
(45) Date of Patent: Mar. 31, 2009

(54) ALD OF AMORPHOUS LANTHANIDE DOPED $TIO_X$ FILMS

(75) Inventors: Kie Y. Ahn, Chappaqua, NY (US);
Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/737,460

(22) Filed: Apr. 19, 2007

(65) Prior Publication Data

US 2007/0187772 A1    Aug. 16, 2007

Related U.S. Application Data

(62) Division of application No. 11/092,072, filed on Mar. 29, 2005, now Pat. No. 7,365,027.

(51) Int. Cl.
*H01L 27/108* (2006.01)
(52) U.S. Cl. .............. 257/310; 257/410; 257/411; 257/E29.132; 438/216; 438/783
(58) Field of Classification Search .............. 257/310, 257/E29.132
See application file for complete search history.

(56) References Cited

U.S. PATENT DOCUMENTS

| | | | |
|---|---|---|---|
| 2,501,563 A | 3/1950 | Colbert et al. | |
| 3,357,961 A | 12/1967 | Makowshi et al. | |
| 4,645,622 A | 2/1987 | Kock | |
| 5,049,516 A | 9/1991 | Arima | |
| 5,426,603 A | 6/1995 | Nakamura et al. | |

(Continued)

FOREIGN PATENT DOCUMENTS

EP    1096042    5/2001

(Continued)

OTHER PUBLICATIONS

Aarik, Jaan, "Atomic layer growth of epitaxial $TiO_2$ thin films from $TiCl_4$ and $H_2O$ on alpha -$Al_2O_3$ substrates", *Journal of Crystal Growth*, 242(1-2), (2002), 189-198.

(Continued)

*Primary Examiner*—Tu-Tu V Ho
(74) *Attorney, Agent, or Firm*—Schwegman, Lundberg & Woessner, P.A.

(57) ABSTRACT

The use of atomic layer deposition (ALD) to form an amorphous dielectric layer of titanium oxide ($TiO_x$) doped with lanthanide elements, such as samarium, europium, gadolinium, holmium, erbium and thulium, produces a reliable structure for use in a variety of electronic devices. The dielectric structure is formed by depositing titanium oxide by atomic layer deposition onto a substrate surface using precursor chemicals, followed by depositing a layer of a lanthanide dopant, and repeating to form a sequentially deposited interleaved structure. Such a dielectric layer may be used as the gate insulator of a MOSFET, as a capacitor dielectric, or as a tunnel gate insulator in flash memories, because the high dielectric constant (high-k) of the layer provides the functionality of a thinner silicon dioxide layer, and because the reduced leakage current of the dielectric layer when the percentage of the lanthanide element doping is optimized.

32 Claims, 5 Drawing Sheets

U.S. PATENT DOCUMENTS

| | | | |
|---|---|---|---|
| 5,572,052 | A | 11/1996 | Kashihara et al. |
| 5,587,609 | A | 12/1996 | Murakami et al. |
| 5,674,563 | A | 10/1997 | Tarui et al. |
| 5,765,214 | A | 6/1998 | Sywyk |
| 6,020,243 | A | 2/2000 | Wallace et al. |
| 6,093,944 | A * | 7/2000 | VanDover .................. 257/310 |
| 6,203,613 | B1 * | 3/2001 | Gates et al. ................. 117/104 |
| 6,352,591 | B1 | 3/2002 | Yieh et al. |
| 6,541,079 | B1 | 4/2003 | Bojarczuk, Jr. et al. |
| 6,617,639 | B1 | 9/2003 | Wang et al. |
| 6,632,279 | B1 | 10/2003 | Ritala et al. |
| 6,674,138 | B1 | 1/2004 | Halliyal et al. |
| 6,699,747 | B2 | 3/2004 | Ruff et al. |
| 6,746,930 | B2 | 6/2004 | Yang et al. |
| 6,759,081 | B2 | 7/2004 | Huganen et al. |
| 6,767,795 | B2 | 7/2004 | Ahn et al. |
| 6,770,923 | B2 | 8/2004 | Nguyen et al. |
| 6,778,441 | B2 | 8/2004 | Forbes et al. |
| 6,780,704 | B1 | 8/2004 | Raaijmakers et al. |
| 6,787,370 | B2 | 9/2004 | Forbes |
| 6,787,413 | B2 | 9/2004 | Ahn et al. |
| 6,790,791 | B2 | 9/2004 | Ahn et al. |
| 6,821,862 | B2 | 11/2004 | Cho |
| 6,821,873 | B2 | 11/2004 | Visokay et al. |
| 6,828,632 | B2 | 12/2004 | Bhattacharyya |
| 6,831,315 | B2 | 12/2004 | Raaijmakers et al. |
| 6,844,203 | B2 | 1/2005 | Ahn et al. |
| 6,852,645 | B2 | 2/2005 | Colombo et al. |
| 6,884,739 | B2 | 4/2005 | Ahn et al. |
| 6,888,739 | B2 | 5/2005 | Forbes |
| 6,921,702 | B2 | 7/2005 | Ahn et al. |
| 6,930,346 | B2 | 8/2005 | Ahn et al. |
| 7,012,311 | B2 | 3/2006 | Ohmi et al. |
| 7,026,694 | B2 | 4/2006 | Ahn et al. |
| 7,045,430 | B2 | 5/2006 | Ahn et al. |
| 7,049,192 | B2 | 5/2006 | Ahn et al. |
| 7,064,058 | B2 | 6/2006 | Ahn et al. |
| 7,081,421 | B2 | 7/2006 | Ahn et al. |
| 7,084,078 | B2 | 8/2006 | Ahn et al. |
| 7,101,813 | B2 | 9/2006 | Ahn et al. |
| 7,129,553 | B2 | 10/2006 | Ahn et al. |
| 7,135,369 | B2 | 11/2006 | Ahn et al. |
| 7,135,421 | B2 | 11/2006 | Ahn et al. |
| 7,160,817 | B2 | 1/2007 | Marsh |
| 7,169,673 | B2 | 1/2007 | Ahn et al. |
| 7,192,824 | B2 | 3/2007 | Ahn et al. |
| 7,235,501 | B2 | 6/2007 | Ahn et al. |
| 7,235,854 | B2 | 6/2007 | Ahn et al. |
| 7,323,423 | B2 | 1/2008 | Brask et al. |
| 7,365,027 | B2 | 4/2008 | Ahn et al. |
| 7,402,876 | B2 | 7/2008 | Ahn et al. |
| 7,410,910 | B2 | 8/2008 | Ahn et al. |
| 7,411,237 | B2 | 8/2008 | Ahn et al. |
| 2001/0002280 | A1 | 5/2001 | Sneh |
| 2001/0030352 | A1 | 10/2001 | Ruf et al. |
| 2001/0036106 | A1 * | 11/2001 | Kato et al. ............. 365/185.11 |
| 2002/0001971 | A1 | 1/2002 | Cho |
| 2002/0142536 | A1 | 10/2002 | Zhang et al. |
| 2002/0177282 | A1 | 11/2002 | Song |
| 2002/0192975 | A1 | 12/2002 | Ahn |
| 2002/0192979 | A1 | 12/2002 | Ahn |
| 2003/0017717 | A1 | 1/2003 | Ahn |
| 2003/0043637 | A1 | 3/2003 | Forbes et al. |
| 2003/0045060 | A1 | 3/2003 | Ahn et al. |
| 2003/0119246 | A1 | 6/2003 | Ahn |
| 2003/0119291 | A1 | 6/2003 | Ahn et al. |
| 2003/0132491 | A1 | 7/2003 | Ahn |
| 2003/0207540 | A1 | 11/2003 | Ahn et al. |
| 2003/0216038 | A1 | 11/2003 | Madhukar et al. |
| 2003/0227033 | A1 | 12/2003 | Ahn et al. |
| 2003/0228747 | A1 | 12/2003 | Ahn et al. |
| 2003/0235961 | A1 | 12/2003 | Metzner et al. |
| 2004/0007171 | A1 | 1/2004 | Ritala et al. |
| 2004/0023461 | A1 | 2/2004 | Ahn et al. |
| 2004/0033681 | A1 | 2/2004 | Ahn et al. |
| 2004/0038554 | A1 | 2/2004 | Ahn |
| 2004/0040494 | A1 | 3/2004 | Vaartstra et al. |
| 2004/0043541 | A1 * | 3/2004 | Ahn et al. .................. 438/128 |
| 2004/0043635 | A1 | 3/2004 | Vaartstra |
| 2004/0104439 | A1 | 6/2004 | Haukka et al. |
| 2004/0159863 | A1 | 8/2004 | Eldridge et al. |
| 2004/0164365 | A1 | 8/2004 | Ahn et al. |
| 2005/0020017 | A1 | 1/2005 | Ahn et al. |
| 2005/0023603 | A1 | 2/2005 | Eldridge et al. |
| 2005/0023626 | A1 | 2/2005 | Ahn et al. |
| 2005/0029547 | A1 | 2/2005 | Ahn et al. |
| 2005/0124174 | A1 | 6/2005 | Ahn et al. |
| 2005/0145957 | A1 | 7/2005 | Ahn et al. |
| 2005/0145959 | A1 | 7/2005 | Forbes |
| 2005/0227442 | A1 | 10/2005 | Ahn et al. |
| 2005/0260357 | A1 | 11/2005 | Olsen et al. |
| 2005/0277256 | A1 | 12/2005 | Ahn et al. |
| 2006/0019033 | A1 | 1/2006 | Muthukrishnan et al. |
| 2006/0023513 | A1 | 2/2006 | Forbes et al. |
| 2006/0028867 | A1 | 2/2006 | Forbes et al. |
| 2006/0028869 | A1 | 2/2006 | Forbes et al. |
| 2006/0043492 | A1 | 3/2006 | Ahn et al. |
| 2006/0043504 | A1 | 3/2006 | Ahn et al. |
| 2006/0046505 | A1 | 3/2006 | Ahn et al. |
| 2006/0046522 | A1 | 3/2006 | Ahn et al. |
| 2006/0125030 | A1 | 6/2006 | Ahn et al. |
| 2006/0128168 | A1 | 6/2006 | Ahn et al. |
| 2006/0148180 | A1 | 7/2006 | Ahn et al. |
| 2006/0176645 | A1 | 8/2006 | Ahn et al. |
| 2006/0183272 | A1 | 8/2006 | Ahn et al. |
| 2006/0189154 | A1 | 8/2006 | Ahn et al. |
| 2006/0223337 | A1 | 10/2006 | Ahn et al. |
| 2006/0228868 | A1 | 10/2006 | Ahn et al. |
| 2006/0237764 | A1 | 10/2006 | Ahn et al. |
| 2006/0245984 | A1 | 11/2006 | Kulkarni et al. |
| 2006/0246741 | A1 | 11/2006 | Ahn et al. |
| 2006/0252211 | A1 | 11/2006 | Ahn et al. |
| 2006/0261397 | A1 | 11/2006 | Ahn et al. |
| 2007/0037415 | A1 | 2/2007 | Ahn et al. |
| 2007/0049054 | A1 | 3/2007 | Ahn et al. |
| 2007/0090440 | A1 | 4/2007 | Ahn et al. |

FOREIGN PATENT DOCUMENTS

| | | |
|---|---|---|
| EP | 1124262 A2 | 8/2001 |
| WO | WO-01/97257 | 12/2001 |
| WO | WO-02/31875 | 4/2002 |

OTHER PUBLICATIONS

Ahn, Kie Y., "Cobalt Titanium Oxide Dielectric Films", U.S. Appl. No. 11/216,958, filed Aug. 31, 2005.

Copel, M., et al., "Formation of a stratified lanthanum silicate dielectric by reaction with Si(001)", *Applied Physics Letters*, 78(11), (Mar. 12, 2001),1607-1609.

Dimoulas, A., et al., "Structural and electrical quality of the high-k dielectric Y2O3 on Si (001): Dependence on growth parameters", *Journal of Applied Physics*, 92(1), (Jul. 1, 2002),426-431.

Eisentraut, K. J., "Volatile Rare Earth Chelates", *J. Am. Chem. Soc.* 87:22, (Nov. 20, 1965),5254-5256.

Gartner, M, "Spectroellipsometric characterization of lanthanide-doped $TiO_2$ films obtained via the sol-gel technique", *Thin Solid Films*, 234(1-2), (1993),561-565.

Guha, S, et al., "Atomic beam deposition of lanthanum-and yttrium-based oxide thin films for gate dielectrics", *Applied Physics Letters*, 77 (2000),2710-2712.

Huang, C. H., et al., "$La_2O_3$ Si0.3 $Ge_{0.7}$ p-MOSFETs with high hole mobility and good device characteristics", *IEEE Electron Device Letters*, 23(12), (Dec. 2002),710-712.

Kim, Byoung-Youp, et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings vol. 672)*, (2001),7.8.1-7.8.6.

Lee, Young H., et al., "Plasma enhanced chemical vapor deposition of $TiO_2$ in microwave-radio frequency hybrid plasma reactor", *J. Vac. Sci. Technol. A* 13(3), (May/Jun. 1995),596-601.

Leskela, M., "ALD precursor chemistry: Evolution and future challenges", *J. Phys. IV France*, 9, (1999),837-852.

Lu, Xu-Bing, et al., "Structure and dielectric properties of amorphous LaAlOsub3 and LaAlOsub x Nsub y films as alternative gate dielectric materials", *Journal of Applied Physics*, 94(2), (Jul. 15, 2003),1229-1234.

Paivasaari, Jani, et al., "A comparitive study on lanthanide oxide thin films grown by atomic layer deposition", *Thin Solid Films*, 472(1-2), First available online in 2004,(Aug. 13, 2004),275-281.

Shimizu, Takashi, et al., "Electrical Properties of Ruthenium/Metalorganic Chemical Vapor Deposited La-Oxide/Si Field Effect Transistors", *Jpn. J. Appl. Phys.*, vol. 42, Part 2, No. 11A, (2003),L1315-L1317.

Sneh, Ofer, "Thin film atomic layer deposition equipment for semiconductor processing", *Thin Solid Films*, 402(1-2), (2002),248-261.

Sun, S. C., et al., "Effects of Electrode Materials and annealing Ambients on the Electrical Properties of $TiO_2$ Thin Films by Metalorganic Chemical Vapor Deposition", *Jpn. J. Appl. Phys.* vol. 36, (Mar. 1997),1346-1350.

Suntola, T., "Atomic Layer Epitaxy", *Handbook of Crystal Growth*, 3; *Thin Films of Epitaxy, Part B: Growth Mechanics and Dynamics*, Amsterdam,(1994),601-663.

Suntola, Tuomo, "Atomic layer epitaxy", *Thin Solid Films*, 216(1), (Aug. 28, 1992),84-89.

Van Dover, R B., "Amorphous lanthanide-doped $TiO_x$ dielectric films", *Applied Physics Letters*, 74(20), (May 1999),3041-3043.

Van Dover, R. B., "Discovery of a useful thin-film dielectric using a composition-spread approach", *Nature*, 392, (Mar. 12, 1998),162-164.

Wilk, G. D., "High-K gate dielectrics: Current status and materials properties considerations", *Journal of Applied Physics*, 89(10), (May 2001),5243-5275.

Yan, J., "Structural and electrical characterization of $TiO_2$ grown from titanium tetrakis-isopropoxide (TTIP) and $TTIP/H_2O$ ambients", *Journal of Vacuum Science & Technology B (Microelectronics and Nanometer Structures)*, 14(3), (May-Jun. 1996),1706-1711.

* cited by examiner

ALD OF AMORPHOUS LANTHANIDE DOPED TIO$_x$ FILMS

This is a divisional of U.S. application Ser. No. 11/092,072 filed Mar. 29, 2005, now U.S. Pat. No. 7,365,027, which is incorporated herein by reference in its entirety.

TECHNICAL FIELD

This application relates generally to semiconductor devices and device fabrication and, more particularly, to dielectric layers and their method of fabrication.

BACKGROUND

The semiconductor device industry has a market driven need to reduce the size of devices such as transistors. Smaller transistors result in improved operational speed and clock rate, and reduced power requirements in both the standby and operational modes. To reduce transistor size, the thickness of the silicon dioxide (SiO$_2$) gate dielectric is reduced in proportion to the shrinkage of the gate length. For example, a metal-oxide-semiconductor field effect transistor (MOSFET) might use a 1.5 nm thick SiO$_2$ gate dielectric for a gate length of less than 100 nm. Such thin gate dielectrics are a potential reliability issue and may be the most difficult issue facing the production of the upcoming generations of MOSFETs. The increasingly small and reliable integrated circuits (ICs) will likely be used in products such as processor chips, mobile telephones, and memory devices such as dynamic random access memories (DRAMs).

The semiconductor industry relies on the ability to reduce (or scale) all of the dimensions of its basic devices, such as the silicon based MOSFET, to achieve improved operational speed and power consumption. Device scaling includes scaling the gate dielectric, which has primarily been formed of silicon dioxide (SiO$_2$). A thermally grown amorphous SiO$_2$ layer provides an electrically and thermodynamically stable material, where the interface of the SiO$_2$ layer with underlying silicon provides a high quality interface as well as superior electrical isolation properties. However, increased scaling and other requirements in microelectronic devices have created reliability issues as the gate dielectric has become thinner. The reliability concerns suggest the use of other dielectric materials as gate dielectrics, particularly materials with higher dielectric constants.

DETAILED DESCRIPTION

Figure 1:
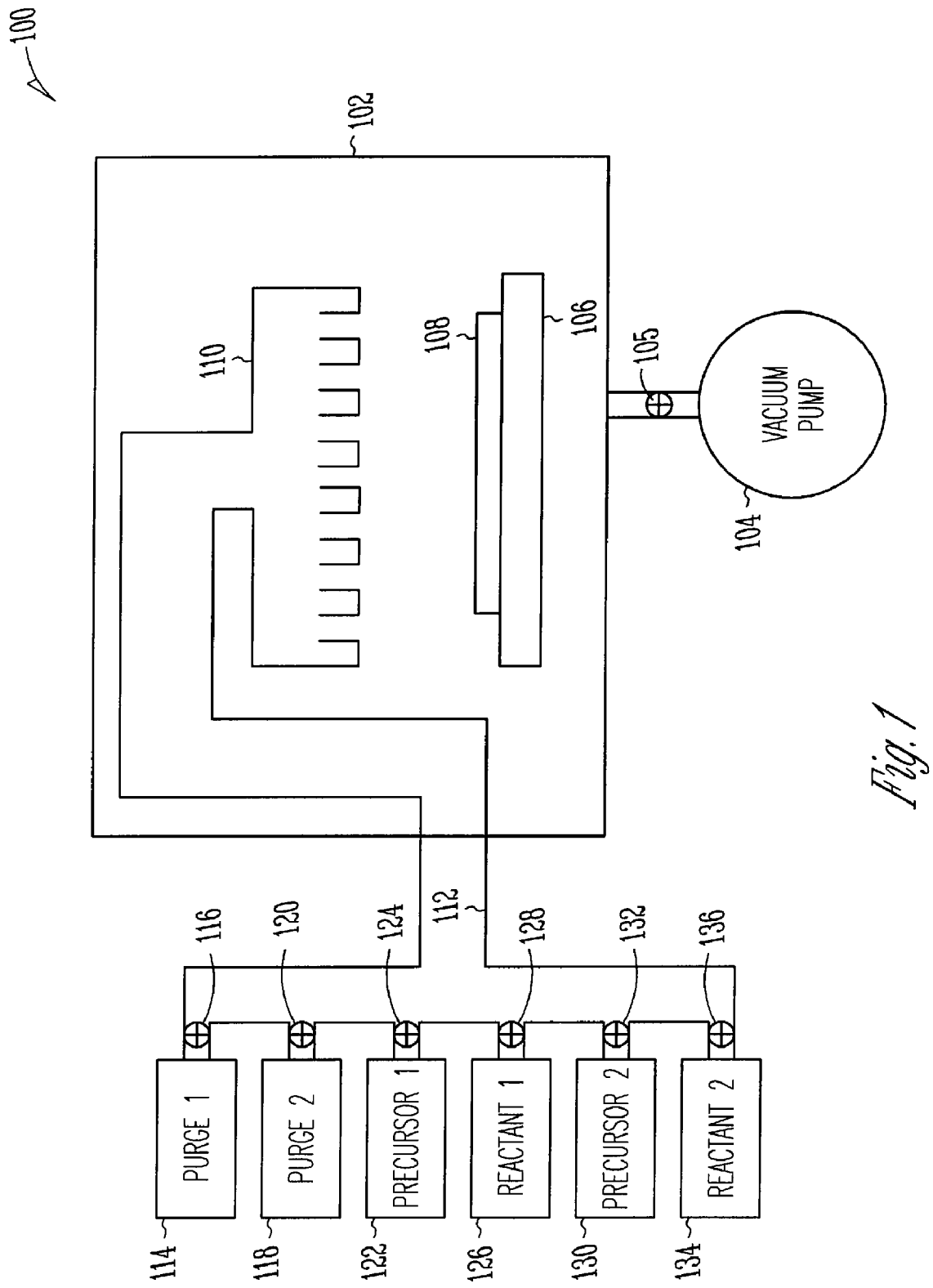
FIG. 1 depicts an atomic layer deposition system for fabricating a dielectric layer formed as a nanolaminate layered sequence of a lanthanide and titanium oxide, according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors, and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical SiO$_2$ layer that would be required to have the same capacitance density as a given dielectric, ignoring leakage current and reliability considerations.

A SiO$_2$ layer of thickness, t, deposited on a Si surface as a gate dielectric will have a $t_{eq}$ larger than its thickness, t. This $t_{eq}$ results from the capacitance in the surface channel on which the SiO$_2$ is deposited due to the formation of a depletion/inversion region. This depletion/inversion region can result in $t_{eq}$ being from 3 to 6 Angstroms (Å) larger than the SiO$_2$ thickness, t. Thus, with the semiconductor industry driving to scale the gate dielectric equivalent oxide thickness to under 10 Å, the physical thickness requirement for a SiO$_2$ layer used for a gate dielectric would need to be approximately 4 to 7 Å.

Additional requirements for a SiO$_2$ layer would depend on the gate electrode used in conjunction with the SiO$_2$ gate dielectric. Using a conventional polysilicon gate would result in an additional undesirable increase in $t_{eq}$ for the SiO$_2$ layer. This additional thickness could be eliminated by using a metal gate electrode, though metal gates are not currently used in typical complementary metal-oxide-semiconductor field effect transistor (CMOS) technology. Thus, future devices would be designed towards a physical SiO$_2$ gate dielectric layer of about 4 Å or less.

Silicon dioxide is used as a gate dielectric, in part, due to its electrical isolation properties in a SiO$_2$—Si based structure. This electrical isolation is due to the relatively large band gap of SiO$_2$ (8.9 eV), which makes it a good insulator. Significant reductions in its band gap would eliminate it as a material for use as a gate dielectric. However, as the thickness of a SiO$_2$ layer decreases, the number of atomic layers, or monolayers of the material in the thickness decreases. At a certain thickness, the number of monolayers will be sufficiently small that the SiO$_2$ layer will not have a complete arrangement of atoms as found in a thicker, or bulk layer. As a result of incomplete formation relative to a bulk structure, a thin SiO$_2$ layer of only one or two monolayers will not form a full band gap. The lack of a full band gap in a SiO$_2$ gate dielectric may cause an effective short between an underlying conductive silicon channel and an overlying polysilicon gate. This undesirable property sets a limit on the physical thickness to which a SiO$_2$ layer can be scaled. The minimum thickness due to this monolayer effect is thought to be about 7-8 Å. Therefore, for future devices to have a $t_{eq}$ less than about 10 Å, other dielectrics than SiO$_2$ need to be considered for use as a gate dielectric.

For a typical dielectric layer used as a gate dielectric, the capacitance is determined as one for a parallel plate capacitance: $C = k\epsilon_0 A/t$, where k is the dielectric constant, $\epsilon_0$ is the permittivity of free space, A is the area of the capacitor, and t is the thickness of the dielectric. The thickness, t, of a material is related to its $t_{eq}$ for a given capacitance, with SiO$_2$ having a dielectric constant $k_{ox} = 3.9$, as $$t = (k/k_{ox})t_{eq} = (k/3.9)t_{eq}.$$

Thus, materials with a dielectric constant greater than that of SiO$_2$ will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than SiO$_2$.

The thinner equivalent oxide thickness required for lower transistor operating voltages and smaller transistor dimensions may be realized by a significant number of materials, but additional fabricating requirements makes determining a suitable replacement for SiO$_2$ difficult. The current view for the future of the microelectronics industry still predicts silicon-based devices. This requires that the gate dielectric employed be grown on a silicon substrate or silicon layer, which places significant constraints on the substitute dielectric material. During the formation of the dielectric on the silicon layer, there exists the possibility that a small layer of SiO$_2$ could be formed in addition to the desired dielectric. The result would effectively be a dielectric layer consisting of two sub-layers in parallel with each other and the silicon layer on which the dielectric is formed. The resulting capacitance would be that of two dielectrics in series, and the $t_{eq}$ of the dielectric layer would be the sum of the SiO$_2$ thickness and a multiplicative factor of the thickness, t, of the dielectric being formed, written as $$t_{eq} = t_{SiO_2} + (k_{ox}/k)t.$$

Thus, if a SiO$_2$ layer is formed in the process, the $t_{eq}$ is again limited by a SiO$_2$ layer. In the event that a barrier layer is formed between the silicon layer and the desired dielectric in which the barrier layer prevents the formation of a SiO$_2$ layer, the $t_{eq}$ would be limited by the layer with the lowest dielectric constant. However, whether a single dielectric layer with a high dielectric constant or a barrier layer with a higher dielectric constant than SiO$_2$ is employed, the layer directly in contact, or interfacing with the silicon layer must provide a high quality interface to maintain high channel carrier mobility. Preventing formation of an undesired SiO$_2$ layer is one advantage of using lower temperatures in atomic layer deposition (ALD).

One of the advantages of using SiO$_2$ as a gate dielectric has been that the formation of the SiO$_2$ layer results in an amorphous gate dielectric. Having an amorphous structure for a gate dielectric provides reduced leakage current problems associated with grain boundaries in polycrystalline gate dielectrics, which may cause high leakage paths. Additionally, grain size and orientation changes throughout a polycrystalline gate dielectric layer may cause variations in the film's dielectric constant, along with uniformity and surface topography problems. Typically, materials having the advantage of a high dielectric constant relative to SiO$_2$ also have the disadvantage of a crystalline form, at least in a bulk configuration. The best candidates for replacing SiO$_2$ as a gate dielectric are those with high dielectric constant, which can be fabricated as a thin layer with an amorphous form. The increased amorphous nature of the film or layer is another advantage of using lower temperatures in the ALD deposition process.

Candidates to replace SiO$_2$ include high-k dielectric materials. High-k materials include materials having a dielectric constant greater than silicon dioxide, for example, dielectric materials having a dielectric constant greater than about twice the dielectric constant of silicon dioxide. An appropriate high-k gate dielectric should have a large energy gap ($E_g$) and large energy barrier heights with the silicon substrate for both electrons and holes. Generally, the band gap is inversely related to the dielectric constant for a high-k material, which lessens some advantages of the high-k material. A set of high-k dielectric candidates for replacing silicon oxide as the dielectric material in electronic components in integrated circuits includes the lanthanide oxides such as $Pr_2O_3$, $La_2O_3$, $Nd_2O_3$, $Sm_2O_3$, $Gd_2O_3$, $Dy_2O_3$, $Ce_2O_3$, $Tb_2O_3$, $Er_2O_3$, $Eu_2O_3$, $Lu_2O_3$, $Tm_2O_3$, $Ho_2O_3$, $Pm_2O_3$, and $Yb_2O_3$. Other candidates include various lanthanide silicates, zirconium oxide $ZrO_2$, titanium oxides such as $TiO_2$, and combinations of these materials. Such high dielectric constant layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. This increased physical thickness aids in reducing leakage current.

Another consideration for selecting the material and method for forming a dielectric layer or film concerns the roughness of a dielectric on a substrate. Surface roughness of the dielectric has a significant effect on the electrical properties of the gate oxide, and the resulting operating characteristics of the transistor. The leakage current through a physical 1.0 nm gate dielectric may increase by a factor of 10 for every 0.1 increase in the root-mean-square (RMS) roughness of the dielectric layer. The crystallization of an amorphous dielectric may cause the surface to become rough, and is another advantage of using ALD precursors that allow a lower deposition temperature.

During a conventional sputtering deposition process, particles of the material to be deposited bombard the surface at a high energy. When a particle hits the surface, some particles adhere, and other particles cause damage. High energy impacts remove body region particles, creating pits. The surface of such a deposited layer may have a rough contour due to the rough interface at the body region.

In an embodiment, a dielectric having a substantially smooth surface relative to other processing techniques is formed using atomic layer deposition (ALD). Further, forming such a dielectric layer or film using atomic layer deposition can provide for controlling transitions between material layers. As a result of such control, atomic layer deposited dielectrics may have an engineered transition with a substrate surface, or may be formed with many thin layers of different dielectric materials to enable selection of the dielectric constant to a value between that available from pure dielectric compounds.

ALD, which may also be known as atomic layer epitaxy (ALE), is a modification of chemical vapor deposition (CVD) and may also be called "alternatively pulsed-CVD." In ALD, gaseous precursors are introduced one at a time to the substrate surface mounted within a reaction chamber (or reactor). This introduction of the gaseous precursors takes the form of sequential pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In the first reaction step of the ALD process the first precursor saturates and is chemisorbed at the substrate surface, during the first pulsing phase. Subsequent pulsing with a purging gas removes excess precursor from the reaction chamber, specifically the precursor that has not been chemisorbed.

The second pulsing phase introduces a second precursor to the substrate where the growth reaction of the desired layer takes place, with a reaction thickness that depends upon the amount of the chemisorbed first precursor. Subsequent to the film growth reaction, reaction byproducts and precursor excess are purged from the reaction chamber. With a precursor chemistry where the precursors adsorb and aggressively react with each other on the substrate, one ALD cycle can be performed in less than one second in properly designed flow type reaction chambers. Typically, precursor pulse times range from about 0.5 sec to about 2 to 3 seconds.

In ALD processes, the saturation of all the reaction and purging phases makes the film growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film or layer thickness in a straightforward manner by controlling the number of growth cycles.

ALD was originally developed to manufacture luminescent and dielectric films needed in electroluminescent displays. ALD has been studied for the growth of different epitaxial II-V and II-VI films, nonepitaxial crystalline or amorphous oxide and nitride films, and multilayer structures of these. There also has been considerable interest towards the ALD growth of silicon and germanium, but due to the difficult precursor chemistry, this has not been very successful.

The precursors used in an ALD process may be gaseous, liquid or solid. However, liquid or solid precursors should be volatile with high vapor pressures or low sublimation temperatures. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors may be used, though evaporation rates may vary somewhat during the process because of changes in surface area.

Other desirable characteristics for ALD precursors include thermal stability at the substrate temperature, since decomposition may destroy surface control and accordingly the advantages of the ALD method, which relies on the reaction of the precursor at the substrate surface. A slight decomposition, if slow compared to the ALD growth, can be tolerated. The precursors should chemisorb on, or react with the surface, though the interaction between the precursor and the surface as well as the mechanism for the adsorption is different for different precursors. The molecules at the substrate surface should react aggressively with the second precursor, which may be called a reactant, to form the desired film. Additionally, precursors should not react with the film to cause etching, and precursors should not dissolve in the film. The use of highly reactive precursors in ALD may contrast with the precursors for conventional metallo-organic CVD (MOCVD) type reactions. Further, the by-products of the reaction should be gaseous in order to allow their easy removal from the reaction chamber during a purge stage. Finally, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse (or purge) to remove excess precursor and by-products from the reaction chamber prior to an input pulse of the next precursor of the fabrication sequence.

By the use of RS-ALD processes, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of ALD include continuity at an interface and avoiding poorly defined nucleating regions, which are typical for thin chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. ALD processes allow for deposition control on the order of single monolayers and the ability to deposit monolayers of amorphous films.

A cycle of an ALD deposition sequence includes pulsing a precursor material, pulsing a purging gas for the precursor, pulsing a reactant precursor, and pulsing the reactant's purging gas, resulting in a very consistent deposition thickness that depends upon the amount of the first precursor that adsorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the reactant's purging gas. There need not be a reactant gas if the precursor can interact with the substrate directly, as in the case of a dopant metal layer on a dielectric layer, as claimed in the present subject matter. In the case where the thickness of the first series of cycles results in a dielectric layer that is only a few molecular layers thick, and the second series of cycles also results in a different dielectric layer that is only a few molecular layers thick, this may be known as a nanolayer material or a nanolaminate. A nanolaminate means a composite film of ultra-thin layers of two or more different materials in a layered stack, where the layers are alternating layers of different materials having a thickness on the order of a nanometer, and may be a continuous film only a single monolayer thick of the material. The nanolayers are not limited to alternating single layers of each material, but may include having several layers of one material alternating with a single layer of the other material, to obtain a desired ratio of the two or more materials. Such an arrangement may obtain a dielectric constant that is between the values of the two or more materials singly. A nanolaminate may also include having several layers of one material formed by an ALD reaction either over or under a single layer of a different material formed by another type of reaction, such as a MOCVD reaction. The layers of different materials may remain separate after deposition, or they may react with each other to form an alloy layer. The alloy layer may be viewed as a doping layer, and the properties of the dielectric layer may be varied by such doping. The present subject matter uses the substitutional incorporation of cations of specific group IIA elements having certain sizes to reduce the leakage currents found in amorphous titanium oxide layers. The result are amorphous doped titanium oxide layers having a formula of a-$Ti_{1-y}L_yO_x$, where y ranges from 0.1 to 0.3, and L represents one of the lanthanide materials including samarium, europium, gadolinium, holmium, erbium and thulium. Other lanthanide materials such as dysprosium and neodymium, and other early transition metals such as zirconium having higher valence levels may also be helpful, especially in combinations.

In an embodiment, a layer of titanium oxide is formed on a substrate mounted in a reaction chamber using sequential atomic layer deposition, which may also be known as RS-ALD. An embodiment includes forming the titanium oxide layers using a precursor gas such as titanium tetra-chloride, having a chemical formula of $TiCl_4$, and water vapor. An embodiment includes forming the lanthanide or lanthanide oxide layer using a diketonate chelate precursor gas such as tetramethyl heptanedione or dipivaloylmethane, and ozone. Other solid or liquid precursors may be used in an appropriately designed reaction chamber. The use of such precursors in an ALD reaction chamber may result in lower deposition temperatures in the range of 100° C. to 250° C. Purge gases may include nitrogen, helium, argon or neon. The lanthanide doped titanium films formed may have good thermal and electrical properties, with a high dielectric constant k=50 to 100. Such films may survive high temperature anneals (sometimes used to reduce fixed surface state charges and improve metal to semiconductor resistance) of up to 1000° C., and have low leakage currents of less than $2\times10^{-7}$ A/cm$^2$ at electric field strengths of one MVolt/cm.

FIG. 1 shows an embodiment of an atomic layer deposition system 100 for forming a dielectric film. The elements depicted permit discussion of the present invention such that those skilled in the art may practice the present invention without undue experimentation. In FIG. 1, a substrate 108 on a heating element/wafer holder 106 is located inside a reaction chamber 102 of ALD system 100. The heating element 106 is thermally coupled to substrate 108 to control the substrate temperature. A gas-distribution fixture 110 introduces precursor, reactant and purge gases to the substrate 108 in a uniform fashion. The gases introduced by the gas distribution fixture, sometimes referred to a showerhead, react with the substrate 108, and any excess gas and reaction products are removed from chamber 102 by vacuum pump 104 through a control valve 105. Each gas originates from individual gas sources 114, 118, 122, 126, 130, and 134, with a flow rate and time controlled by mass-flow controllers 116, 120, 124, 128, 132 and 136, respectively. Gas sources 122 and 130 provide a precursor gas, either by storing the precursor as a gas or by providing for evaporating a solid or liquid material to form the selected precursor gas.

Also included in the system are purging gas sources 114 and 118, coupled to mass-flow controllers 116 and 120, respectively. The embodiment may use only one of the purge gases for all four disclosed illustrative purging steps, or both purge gases may be used simultaneously, or alternately as required for the particular desired result. Furthermore, additional purging gas sources can be constructed in ALD system 100, one purging gas source for each different precursor and reactant gas, for example. For a process that uses the same purging gas for multiple precursor gases, fewer purging gas sources may be required for ALD system 100. The precursor, reactant and purge gas sources are coupled by their associated mass-flow controllers to a common gas line or conduit 112, which is coupled to the gas-distribution fixture 110 inside the reaction chamber 102. Gas conduit 112 may also be coupled to another vacuum pump, or exhaust pump, not shown, to remove excess precursor gases, purging gases, and by-product gases at the end of a purging sequence from the gas conduit 112.

Vacuum pump, or exhaust pump, 104 is coupled to chamber 102 by control valve 105, which may be a mass-flow valve, to remove excess precursor gases, purging gases, and by-product gases from reaction chamber 102 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present invention, other commercially available ALD systems may also be used.

The use, construction and operation of reaction chambers for deposition of films are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 100 may be controlled by a computer using a computer readable medium having computer executable instructions to control the individual elements such as pressure, temperature, and gas flow within ALD system 100. To focus on the use of ALD system 100 in the various embodiments of the present invention, the computer is not shown.

Figure 2:
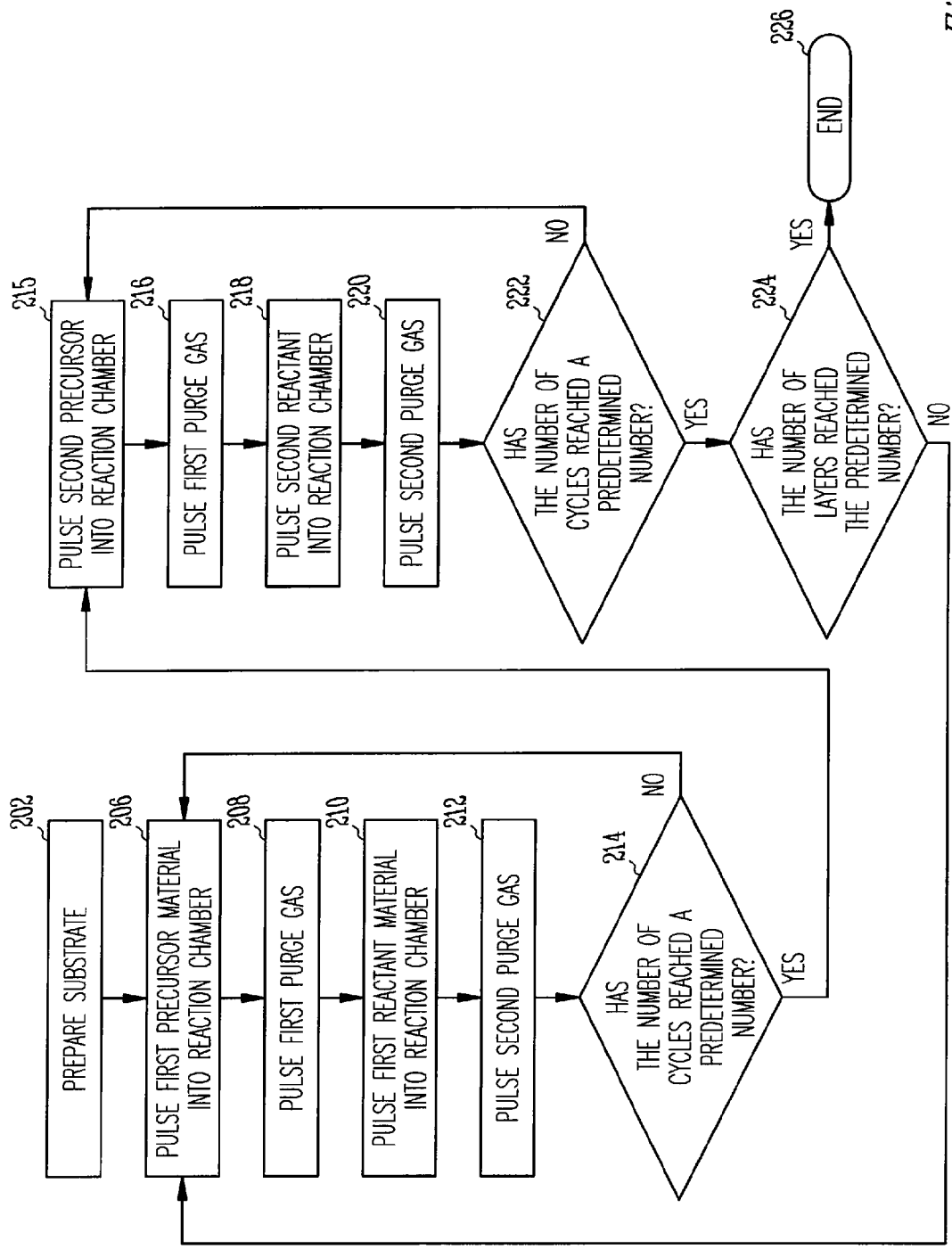
FIG. 2 illustrates a flow diagram of elements for an embodiment of a method to form a dielectric layer containing lanthanide doped titanium oxide by atomic layer deposition according to various embodiments of the present invention.

FIG. 2 illustrates a flow diagram of operational steps for an embodiment of a method to form a nanolaminate dielectric layer having an illustrative two different materials. At 202, a substrate is prepared to react immediately with, and chemisorb the first precursor gas. This preparation will remove contaminants such as thin organic films, dirt, and native oxide from the surface of the substrate, and may include a hydrofluoric acid rinse, or a sputter etch in the reaction chamber 102. At 206 a first precursor material enters the reaction chamber for a predetermined length of time, for example 0.5-2.0 seconds. The first precursor material is chemically adsorbed onto the surface of the substrate, the amount depending upon the temperature of the substrate, in one embodiment 300° C. and the presence of sufficient flow of the precursor material. In addition, the pulsing of the precursor may use a pulsing period that provides uniform coverage of an adsorbed monolayer on the substrate surface, or may use a pulsing period that provides partial formation of a monolayer on the substrate surface. An example precursor gas includes $TiCl_4$.

At 208 a first purge gas enters the reaction chamber for a predetermined length of time sufficient to remove substantially all of the non-chemisorbed first precursor material. Typical times may be 1.0-2.0 seconds with a purge gas comprising nitrogen, argon, neon, combinations thereof, or other gases such as hydrogen. At 210 a first reactant gas enters the chamber for a predetermined length of time, sufficient to provide enough of the reactant to chemically combine with the amount of chemisorbed first precursor material on the surface of the substrate. Typical reactant materials include mildly oxidizing materials such as water vapor, but may in general also include hydrogen peroxide, nitrogen oxides, ozone and oxygen gas, and combinations thereof. At 212 a second purge gas, which may be the same or different from the first purge gas, enters the chamber for a predetermined length of time, sufficient to remove substantially all non-reacted materials and any reaction byproducts from the chamber.

At 214 a decision is made as to whether or not the thickness of the first dielectric material in the dielectric has reached the desired thickness, or whether another deposition cycle is required. If another deposition cycle is needed, then the operation returns to 206, until the desired first dielectric layer is completed, at which time the process moves on to the deposition of the second material at 215. At 215 a second precursor material enters the reaction chamber for a predetermined length of time, typically 0.5-2.0 seconds. The second precursor material is chemically adsorbed onto the surface of the substrate, in this case the top surface of the first dielectric material, the amount of absorption depending upon the temperature of the substrate, and the presence of sufficient flow of the precursor material. In addition, the pulsing of the precursor may use a pulsing period that provides uniform coverage of an adsorbed monolayer on the substrate surface, or may use a pulsing period that provides partial formation of a monolayer on the substrate surface.

At 216 the first purge gas is shown as entering the chamber, but the invention is not so limited. The purge gas used in the second dielectric material deposition may be the same or different from either of the two previously noted purge gases, and FIG. 1 could be shown as having more than the two purge gases shown. The purge cycle continues for a predetermined length of time sufficient to remove substantially all of the non-chemisorbed second precursor material.

At 218 an illustrative second reactant gas, which may be the same or different from the first reactant gas, enters the chamber for a predetermined length of time, sufficient to provide enough of the reactant to chemically combine with the amount of chemisorbed second precursor material on the surface of the substrate. In an embodiment, there is no second reactant gas, and the precursor chemically reacts with the first material to form an alloy or a doped layer of the first material. At 220 another purge gas enters the chamber, which may be the same or different from any of the three previously discussed purge gases, for a predetermined length of time, sufficient to remove substantially all non-reacted materials and any reaction byproducts from the chamber.

At 222 a decision is made as to whether or not the thickness of the second material in the nanolaminate dielectric has reached the desired thickness, or whether another deposition cycle is required. If another deposition cycle is needed, then the operation returns to 215, until the desired second layer is completed. The desired thicknesses of the first and second materials in the dielectric may not be the same thickness, and there may be more deposition cycles for one material as compared to the other. If the second layer has reached the desired thickness, the process moves on to a decision at 224 of whether the number of layers of the first and second materials has reached the desired number. In this illustrative embodiment a single layer of the first dielectric and a single layer of the second material have been completed at this point in the process. If more than a single layer of each material is desired, the process moves back to another deposition of the first dielectric material at 206. After the number of interleaved layers of dielectrics one and two has reached the desired value, the deposition ends at 226. Because the dielectric values of the ALD oxides in the described embodiment are high, for example lanthanide doped titanium oxide may have a dielectric constant of 50 to 100, and because the highly controlled layer thickness may be a single monolayer for each one of the interleaved dielectric layers, the physical thickness needed to obtain the equivalent dielectric properties of a very thin silicon dioxide layer may have from two to ten layers of the two dielectric materials described in the embodiments.

The embodiments described herein provide a process for growing a dielectric film having a wide range of useful equivalent oxide thickness, $t_{eq}$, associated with a dielectric constant in the range from about 50 to about 100. This range of dielectric constants provides for a $t_{eq}$ ranging up to 4% relative to a given silicon dioxide thickness, that is, it appears to be equivalent to a silicon dioxide layer that is 25 times thinner, providing enhanced probability for reducing leakage current. Controlling the amount of lanthanide doping in the titanium film to 10 to 30% results in relatively low leakage current as compared to pure titanium oxides. Additionally, the novel process can be implemented to form transistors, capacitors, memory devices, and other electronic systems including information handling devices. The invention is not limited to two dielectric materials, and the equipment described in FIG. 1 could have included a precursor and reactant 3, 4, which are not described for simplicity, or there may be two or more simultaneous flows of different lanthanide precursors during the second material deposition.

Figure 3:
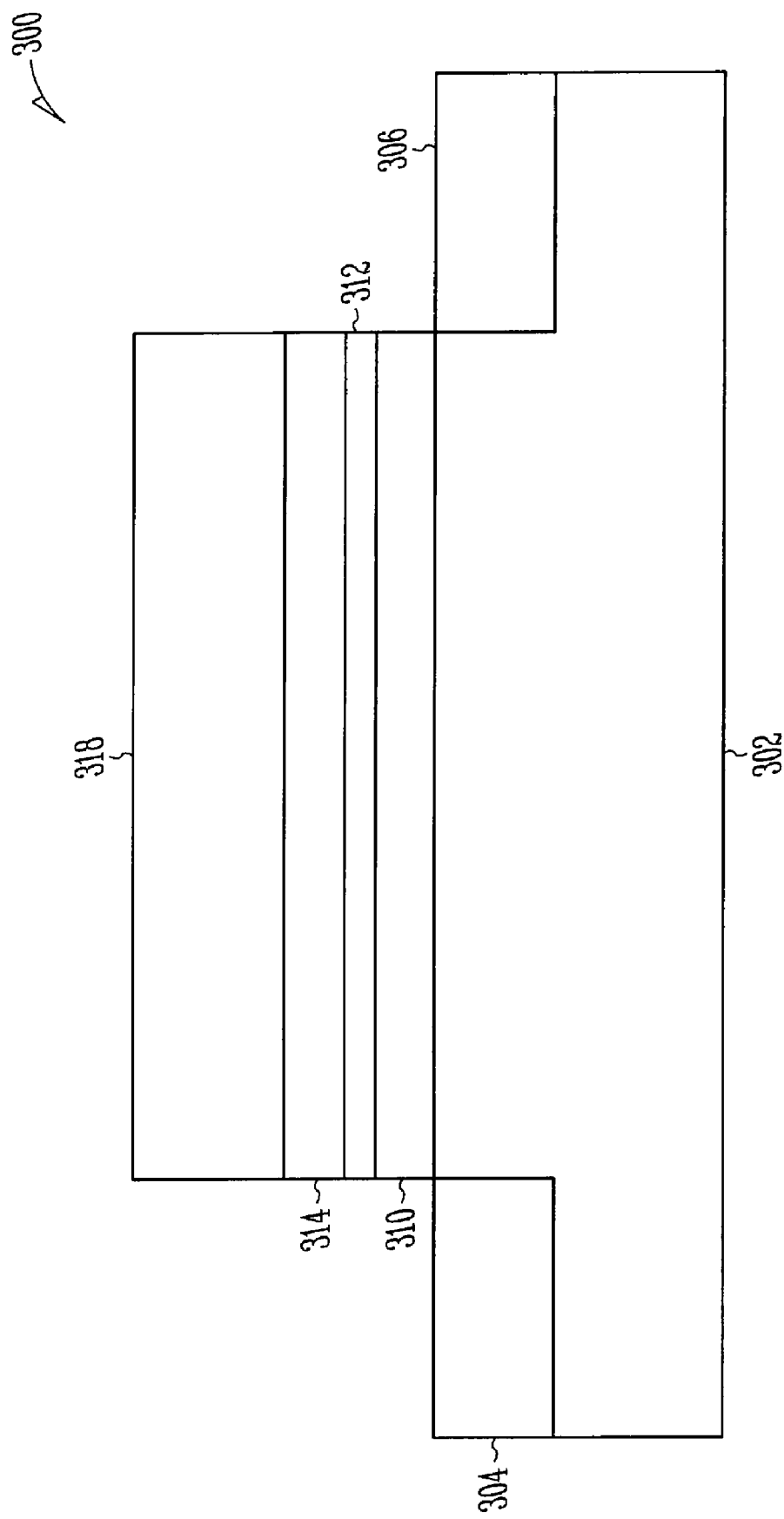
FIG. 3 illustrates an embodiment of a configuration of a transistor having a dielectric layer containing an atomic layer deposited containing lanthanide doped titanium oxide, according to the present invention.

FIG. 3 illustrates a single transistor 300 in an embodiment of a method to form a dielectric layer containing an ALD deposited lanthanide doped titanium gate oxide layer. This embodiment may be implemented with the system 100 of FIG. 1 used as an atomic layer deposition system. A substrate 302 is prepared, typically a silicon or silicon containing material. In other embodiments, germanium, gallium arsenide, silicon-on-sapphire substrates, or other suitable substrates may also be used. The preparation process includes cleaning substrate 302 and forming various layers and regions of the substrate, such as drain diffusion 304 and source diffusion 306 of an illustrative metal oxide semiconductor (MOS) transistor 300, prior to forming a gate dielectric. In an embodiment, the substrate is cleaned to provide an initial substrate depleted of its native oxide. In an embodiment, the initial substrate is cleaned to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer. Cleaning immediately preceding atomic layer deposition aids in reducing an occurrence of silicon oxide as an interface between the silicon substrate and the dielectric formed using the atomic layer deposition process. The sequencing of the formation of the regions of the transistor being processed may follow the generally understood fabrication of a MOS transistor as is well known to those skilled in the art.

The dielectric covering the area on the substrate 302 between the source and drain diffused regions 304 and 306 may be deposited by ALD in this illustrative embodiment, and may comprise one or more titanium oxide layers 310 and 314, each potentially formed of many individual layers. There is shown a sequentially interleaved lanthanide or lanthanide oxide layer 312. Alternatively, there may be other combinations of interleaved and non-interleaved layers of varying thickness and deposition method. This nanolaminate dielectric layer is referred to as the gate oxide, and while shown as distinct layers for clarity, is a single alloyed layer, or doped layer. There may be a diffusion barrier layer inserted between the first dielectric layer 310 and the substrate 302 to prevent metal contamination from affecting the electrical properties of the device. The illustrative embodiment shows the two titanium dielectric layers 310 and 314 having the same thickness, however the desired dielectric properties of the nanolaminate film may be best achieved by adjusting the ratio of the thickness of the two dielectric layers to different values. The transistor 300 has a conductive material forming a gate 318 in this illustrative embodiment, but the nanolaminate dielectric may also be used in a floating gate device such as an EEPROM transistor, as either one or both of the floating gate and the control gate oxide layers. The conductive material may be polysilicon or various metals.

In an illustrative embodiment, gate dielectric (layers 310-314) include a tunnel gate insulator and a floating gate dielectric in a flash memory device. Use of dielectric layers containing a nanolaminate atomic layer deposited dielectric layer for a gate dielectric and/or floating gate dielectric in which the dielectric layer contacts a conductive layer is not limited to silicon based substrates, but may be used with a variety of semiconductor substrates.

Figure 4:
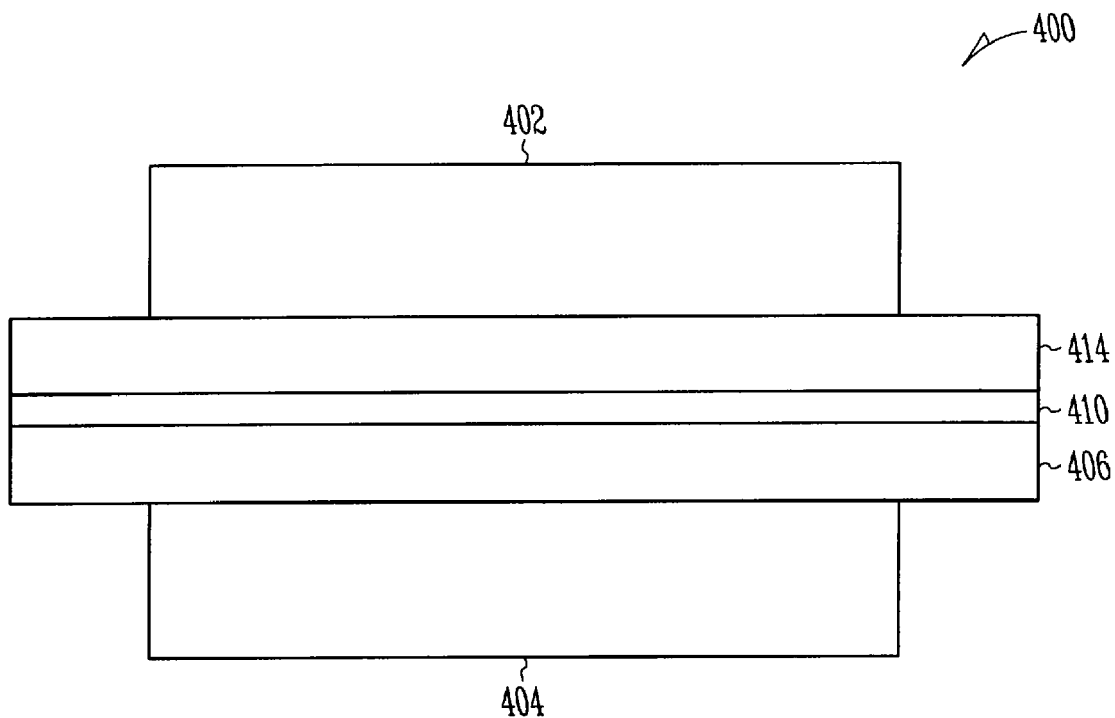
FIG. 4 shows an embodiment of a configuration of a capacitor having a dielectric layer containing an atomic layer deposited lanthanide doped titanium oxide, according to the present invention.

Embodiments of methods for forming dielectric layers containing an ALD deposited dielectric layer contacting a conductive layer may also be applied to forming capacitors in various integrated circuits, memory devices, and electronic systems. In an embodiment including a capacitor 400 illustrated in FIG. 4, a method includes forming a first conductive layer 402, a second conductive layer 404, having a nanolaminate dielectric having interleaved layers 406-414 of two different materials, formed between the two conductive layers. The conductive layers 402 and 404 may include metals, doped polysilicon, silicided metals, polycides, or conductive organic compounds, without affecting the teachings of this embodiment. The sequencing and thickness of the individual layers depends on the application and may include a single layer of each material, one layer of one of the materials and multiple layers of the other, or other combinations of layers including different layer thicknesses. By selecting each thickness and the composition of each layer, a nanolaminate structure can be engineered to have a predetermined dielectric constant and composition. In an embodiment the total of layers 406 and 414 are ten times the thickness of layer 410, providing a 10% doping of layer 410 material (for example a lanthanide oxide) in the layer 406/414 material (for example titanium oxide). Although the oxide layers are shown in this illustrative example as being distinct layers, the oxide may be alloyed together to form a single material layer. Structures such as the nanolaminate structure shown in FIGS. 3 and 4 may be used in NROM flash memory devices as well as other integrated circuits. Transistors, capacitors, and other devices having dielectric films may be implemented into memory devices and electronic systems including information handling devices. Embodiments of these information handling devices include wireless systems, telecommunication systems, computers and integrated circuits.

Figure 5:
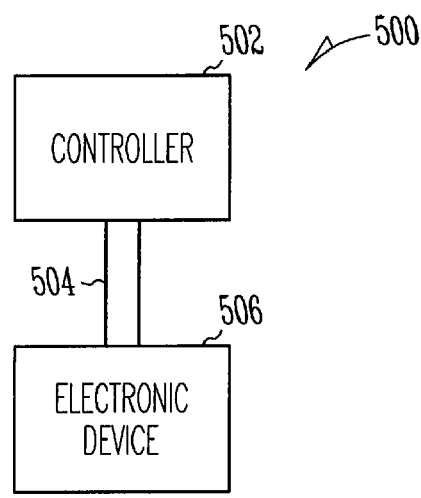
FIG. 5 is a simplified diagram for an embodiment of a controller coupled to an electronic device, according to the present invention.

FIG. 5 illustrates a diagram for an electronic system 500 having one or more devices having a dielectric layer containing an atomic layer deposited oxide layer formed according to various embodiments of the present invention. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for a dielectric layer containing sequentially deposited ALD layers as previously discussed herein. Electronic system 500 may include, but is not limited to, information handling devices, wireless systems, telecommunication systems, fiber optic systems, electro-optic systems, and computers.

Figure 6:
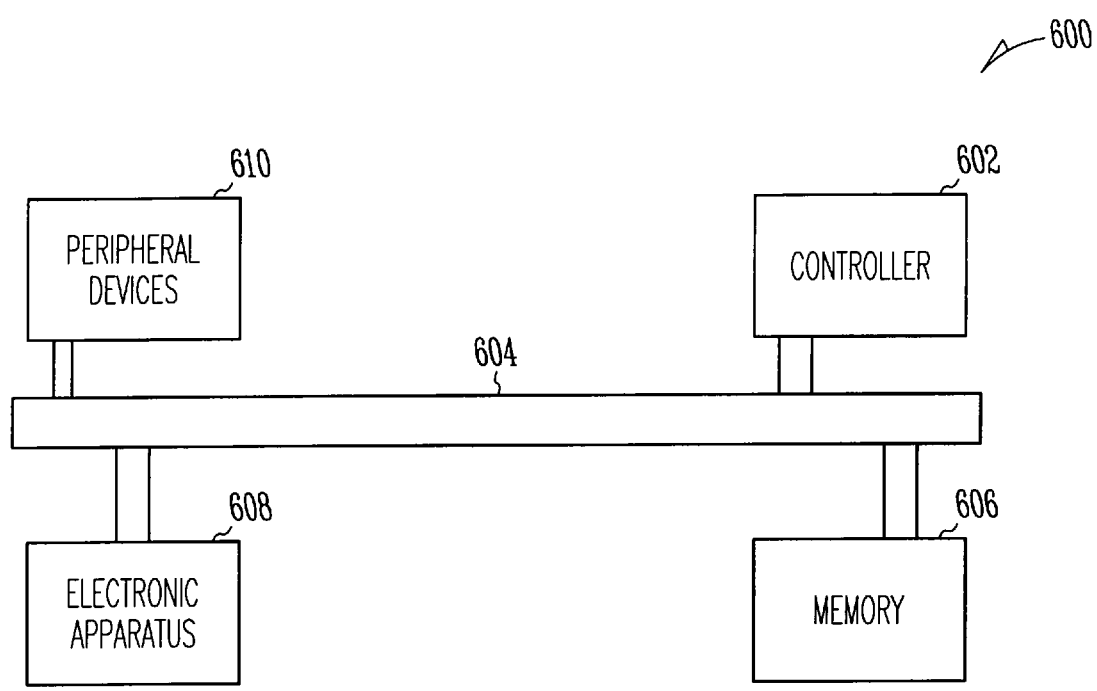
FIG. 6 illustrates a diagram for an embodiment of an electronic system having devices with a dielectric film containing an atomic layer deposited layered sequence of lanthanide doped titanium oxide, according to the present invention.

FIG. 6 depicts a diagram of an embodiment of a system 600 having a controller 602 and a memory 606. Controller 602 and/or memory 606 includes a dielectric layer having a nanolaminate RS-ALD dielectric layer. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment controller 602 is a processor. Any of controller 602, memory 606, bus 604, electronic apparatus 608, and peripheral device or devices 610 may include a dielectric layer having an ALD deposited oxide layer in accordance with the disclosed embodiments.

System 600 may include, but is not limited to, information handling devices, telecommunication systems, and computers. Peripheral devices 610 may include displays, additional storage memory, or other control devices that may operate in conjunction with controller 602 and/or memory 606. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

Formation of nanolaminate lanthanide doped titanium oxide layers by an ALD deposition may be realized using a diketonate type chelate precursor chemical, such as L(thd)$_3$, and an oxidizing precursor, such as ozone. Further, such doped dielectric films formed in relatively low temperatures, such as 250° C. or lower, may be amorphous and possess smooth surfaces. Such oxide films may provide enhanced electrical properties as compared to physical deposition methods, such as sputtering, or typical chemical layer depositions, due to their smoother surface, and reduced damage, resulting in reduced leakage current. Additionally, such dielectric layers provide a significantly thicker physical thickness than a silicon oxide layer having the same equivalent oxide thickness, where the increased thickness may also reduce leakage current issues. These properties of RS-ALD deposited dielectric layers allow for application as dielectric layers in electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films containing atomic layer deposited lanthanide oxide are formed having a dielectric constant (k) substantially higher than that of silicon oxide, such that these dielectric films possess an equivalent thickness, $t_{eq}$, thinner than SiO$_2$ gate dielectrics of the same physical thickness. Alternatively, the high dielectric constant relative to silicon dioxide allows the use of much larger physical thickness of these high-k dielectric materials for the same $t_{eq}$ of SiO$_2$. Film having the relatively larger physical thickness aids in processing gate dielectrics and other dielectric layers in electronic devices and systems, and improves the electrical properties of the dielectrics.

CONCLUSION

Embodiments for a method for forming an electronic device include forming a dielectric layer by using an atomic layer deposition (ALD) technique to form a dielectric having a lanthanide, or a lanthanide oxide (for example Sm$_2$O$_3$) doped titanium oxide (TiO$_x$) layer. Titanium is elemental metal number 22, and the lanthanide series includes element numbers 57 to element 71. Titanium oxide films, for example TiO$_2$ titanium dioxide, may be atomic layer deposited using various precursors such as titanium tetrachloride TiCl$_4$ and water vapor H$_2$O at a temperature of between 100 to 250° C. Lanthanide or lanthanide oxide films may be atomic layer deposited using various other precursors, such as a volatile diketonate chelates, for example 2,2,6,6-tetramethyl-3,5-heptanedione, and ozone at less than 250° C.

These disclosed layers may have a very tightly controlled thickness for each deposition cycle that depends on the chemical saturation of the substrate surface. The surface of the layer formed by ALD may also be very smooth and continuous, even over sharp underlying topography. The deposition cycles may also be alternated between the two different materials, and the resulting layer may be either a nanolaminate of the two or more different oxides, or the oxides may form an alloy with each other if the similarity between the two metals results in miscible materials. In either case the film properties may vary depending upon the ratio of the two or more different materials, and thus materials may be formed that have engineered properties.

The low temperature deposition of ALD depositions may result in dielectric layers that are amorphous even after subsequent heat cycles such as densification and mild oxidative repair cycles. Silicon dioxide layers grown by oxidation of silicon substrates are amorphous, and the subsequent heat cycles typically used in semiconductor fabrication do not substantially change the amorphous nature of the silicon dioxide. This may be important since crystallization of a dielectric may cause the surface to become rough, which may cause greatly increased leakage across the dielectric. The crystallization of a dielectric may also cause the covering conductive layer to form sharp spikes, which may increase the local electric field to a level that may cause dielectric breakdown and result in a short circuit.

The dielectric structure is formed by depositing titanium by atomic layer deposition (ALD) onto a substrate surface using precursor chemicals to form a layer of TiO$_2$ or some other titanium oxide, followed by ALD depositing of one or more lanthanide or lanthanide oxide materials selected from samarium, europium, gadolinium, holmium, erbium and thulium, onto the substrate using precursor chemicals and repeating as often as necessary to form a dielectric structure of the required thickness and atomic percentage of lanthanide doping. An embodiment may have a lanthanide percentage of from 10 to 30%. An alloyed amorphous dielectric layer of lanthanide doped titanium oxide may be beneficially used because the high dielectric constant (high-k) of from about 50-110 of the film, as compared to 3.9 for silicon dioxide, and the excellent current leakage value, provides the functionality of a much thinner silicon dioxide film without the reliability loss consequent to using such physically thin films.

An embodiment may include a method of forming an amorphous dielectric layer on a substrate by atomic layer deposition at a predetermined temperature, the dielectric layer containing at least one titanium oxide layer doped by at least one layer of a lanthanide selected from the list including samarium, europium, gadolinium, holmium, erbium and thulium. The dielectric layer may then be annealed at least once in either a non oxidizing ambient to make the layer more dense, or in a mildly oxidizing ambient to repair defects in the dielectric layer, or both. An electrically conductive layer may then be formed on the dielectric layer. The predetermined temperature may be in a range of approximately 100° C. to 250° C.

The disclosed methods may be used to form transistors, capacitors, and non volatile memory devices. The amorphous dielectric layer may be a number of individual titanium oxide layers, with at least one lanthanide layer interleaved between each one of the titanium oxide layers. The titanium oxide layers may be a group of continuous mono-layers of titanium oxide, each approximately 0.12 nm in thickness. The atomic ratio of the lanthanide to the titanium may be from 10 to 30%, and may be a single lanthanide or a mixture of two or more lanthanides to obtain a dielectric constant value in the range from 50 to 100. The proper choice of titanium to lanthanide ratio may be selected to obtain a leakage current of less than 10$^{-8}$ A/cm$^2$, and a breakdown voltage of greater than 2.0 MV/cm. The dielectric layer may be very smooth, having a root mean square surface roughness that is less than one tenth of the layer thickness, which may improve the breakdown voltage and leakage current.

The lanthanide layer may be formed of two different lanthanides sequentially deposited between the titanium oxide layers, or the two lanthanides may be deposited simultaneously. The dielectric may be annealed in an inert ambient at a temperature less than 1000° C. for about one minute, and then annealed in a mildly oxidizing ambient at a temperature of less than 700° C. for about one minute, and the oxidizing ambient may be at a reduced pressure of about 1 Torr of either oxygen, ozone, nitrous oxide, hydrogen peroxide and water vapor, or combinations thereof in order to improved the dielectric properties.

The atomic layer deposition may have an activated substrate surface at a preselected temperature exposed to a titanium-containing first precursor material for a first time period and flow volume, which saturates the substrate surface. Then a first purge for a second time period removes substantially all of the non-adsorbed portion of the first precursor material from the substrate surface. Then the substrate surface is exposed to a first oxidizing reactant material which reacts with the adsorbed first precursor material on the substrate surface to form a first titanium oxide material to complete a first deposition cycle. The deposition cycle is repeated until a desired first dielectric material thickness is obtained. Then the substrate surface is exposed to a lanthanide-containing second precursor material to saturate the substrate surface with the second precursor material, which is repeated to obtain the second material thickness. Alternatively, the lanthanide dopant may be in the form of a lanthanide oxide layer formed in the second deposition cycle by adding a second oxidizing reactant material.

In one embodiment, the first precursor may be titanium tetrachloride ($TiCl_4$) and the reactant may be water vapor ($H_2O$). The deposition temperature is less than 250° C. The second precursor material may have a formula $L(thd)_3$, where L is one of the lanthanide materials, and thd is 2,2,6,6-tetramethy-3,5-heptanedione. The lanthanide doped titanium oxide film may be a continuous layer having a root mean square surface roughness of less than 10 angstroms and a current leakage rate of less than $2 \times 10^{-7}$ amps per $cm^2$ at an electric field strength of 1 megavolt per cm. The amorphous dielectric layer may have an equivalent oxide thickness of less than 10 Angstroms, or less than 7 Angstroms, or even less than 4 Angstroms, and a breakdown voltage of greater than 2.5 MV/cm due to the higher physical thickness, the smoothness of the amorphous dielectric, and the proper atomic percentage of lanthanide dopant in the titanium oxide film.

Embodiments may generally include structures used for capacitors, transistors, memory devices, and electronic systems with dielectric layers containing an atomic layer deposited lanthanide doped titanium oxide dielectric, and methods for forming such structures.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. An electronic device comprising:
    an amorphous dielectric layer containing an atomic layer deposited dielectric layer of lanthanide doped titanium oxide, comprising at least two layers of titanium oxide and at least one layer of a lanthanide oxide selected from the list comprising at least one of samarium, europium, gadolinium, holmium, erbium and thulium oxide disposed between the at least two layers of titanium oxide in an integrated circuit; and
    a conductive layer contacting the dielectric layer.

2. The electronic device of claim 1, wherein the lanthanide comprises about 10% of the atomic percent of the dielectric film, and the dielectric film constant is about 100.

3. The electronic device of claim 1, wherein the electronic device includes a memory having the dielectric as a gate insulator in a transistor device.

4. The electronic device of claim 3, wherein the gate insulator in the memory device comprises an inter-gate insulator in a flash memory device.

5. The electronic device of claim 1, wherein the electronic device includes a transistor in the integrated circuit, the transistor having the dielectric layer as a gate insulator and the conductive layer as a gate in the transistor.

6. The electronic device of claim 1, wherein the electronic device includes a complementary metal-oxide semiconductor (CMOS) transistor in the integrated circuit, the CMOS transistor having the dielectric layer as a gate insulator and the conductive layer as a gate.

7. The electronic device of claim 1, wherein the electronic device includes a capacitor having the dielectric layer as a dielectric material between two electrodes in the capacitor, the capacitor having the conductive layer as at least one of the two electrodes.

8. An electronic system comprising:
    a controller;
    an electronic device coupled to the controller, wherein the electronic device includes:
        an amorphous dielectric layer comprising an atomic layer deposited dielectric layer of lanthanide doped titanium oxide, comprising at least two layers of titanium oxide and at least one layer of a lanthanide oxide in an integrated circuit where the lanthanide material is selected from the list including samarium, europium, gadolinium, holmium, erbium and thulium, having an atomic percent of from about 10% to about 30% and a dielectric constant of from about 50 to about 100; and
        a conductive layer contacting the dielectric layer.

9. The electronic system of claim 8, wherein the electronic device includes at least one memory device.

10. A transistor, comprising:
    a semiconductor substrate;
    a dielectric layer including at least two layers of an oxide formed of at least one metal from column IVA of the periodic table of elements, and at least one layer of an oxide formed of at least one lanthanide material disposed therebetween, the dielectric layer disposed on the semiconductor substrate and having an equivalent oxide thickness of less than about 10 Angstroms, a dielectric constant of greater than about 30, and a breakdown voltage of greater than about 2.5 MV/cm; and
    a conductive layer disposed on the dielectric layer.

11. The transistor of claim 10, wherein the dielectric layer is amorphous.

12. The transistor of claim 11, wherein the amorphous dielectric layer comprises at least one of a titanium oxide film and a zirconium oxide film doped with from about 0.1 to about 30 atomic percent of a lanthanide material selected from the list including samarium, europium, gadolinium, holmium, erbium, and thulium, having a dielectric constant of from about 30 to about 110.

13. The transistor of claim 12, wherein the amorphous dielectric layer titanium dioxide includes titanium dioxide having an approximate formula of $TiO_2$.

14. The transistor of claim 10, wherein the dielectric layer has a root mean square surface roughness of less than about 10 Angstroms and a current leakage rate of less than about $2\times10^{-7}$ amps per $cm^2$ at an electric field strength of about 1 MV/cm.

15. The transistor of claim 10, wherein the dielectric layer has a current leakage rate of less than about $1\times10^{-8}$ amps per $cm^2$ at an electric field strength of about 2 MV/cm.

16. The transistor of claim 11, wherein the amorphous dielectric layer comprises at least one layer comprising titanium oxide and at least one layer comprising a lanthanide oxide selected from the group including samarium, europium, gadolinium, holmium, erbium, thulium, dysprosium and neodymium oxides to form a nano-laminated dielectric layer.

17. The transistor of claim 16, wherein the amorphous nano-laminated dielectric layer comprises a first layer of titanium dioxide having a first thickness, a second layer of a lanthanide oxide having a second thickness, a third layer of titanium dioxide having the first thickness, and a fourth layer of the lanthanide oxide having the second thickness.

18. The transistor of claim 17, wherein the amorphous nano-laminated dielectric layer comprises repeated alternating layers of titanium dioxide and lanthanide oxide until a selected total dielectric layer thickness is obtained.

19. The transistor of claim 18, wherein the titanium dioxide layer is about 0.12 nm in thickness.

20. The transistor of claim 17, wherein an effective overall dielectric layer dielectric constant depends upon the ratio of the first thickness and the second thickness and the lanthanide oxide dielectric constant.

21. The transistor of claim 10, wherein the dielectric layer has a root mean square surface roughness of less than about 2 Angstroms.

22. The transistor of claim 10, wherein the dielectric layer disposed on the semiconductor layer has an equivalent oxide thickness of less than about 7 Angstroms.

23. The transistor of claim 10, wherein the dielectric layer disposed on the semiconductor layer has an equivalent oxide thickness of less than about 4 Angstroms.

24. An electronic device comprising:
a dielectric layer containing an atomic layer deposited dielectric layer of lanthanide doped titanium oxide including at least two layers titanium oxide, and at least one layer of an oxide formed of at least one lanthanide material disposed therebetween; and
a conductive layer contacting the dielectric layer.

25. The electronic device of claim 24, wherein the titanium oxide comprises titanium dioxide having an approximately formula of $TiO_2$, the lanthanide doping comprises about 10% of the atomic percent of the titanium in the dielectric film, and the dielectric layer has a dielectric constant of about 100.

26. The electronic device of claim 24, wherein the electronic device includes a memory having the lanthanide doped titanium oxide dielectric as a gate insulator in a transistor device.

27. The electronic device of claim 26, wherein the gate insulator in the memory device includes an inter-gate insulator disposed between a floating gate electrode and a control gate electrode in a flash memory device.

28. The electronic device of claim 24, wherein the dielectric layer has an equivalent oxide thickness of from about 4 to about 7 Angstroms of silicon dioxide.

29. The electronic device of claim 24, wherein the electronic device includes at least one complementary metal-oxide semiconductor transistor in the integrated circuit.

30. The electronic device of claim 24, wherein the dielectric layer is amorphous and comprises at least one layer comprising titanium dioxide and at least one layer comprising a lanthanide oxide selected from the list consisting of samarium, europium, gadolinium, holmium, erbium and thulium, oxides to form a nano-laminated dielectric layer.

31. The electronic device of claim 24, wherein the dielectric layer comprises a selected total dielectric layer thickness including a first layer of titanium dioxide having a first thickness, a second layer of a lanthanide oxide having a second thickness, a third layer of titanium dioxide having the first thickness, and a fourth layer of the lanthanide oxide having the second thickness, and alternating layers of titanium dioxide and lanthanide oxide to obtain the total dielectric thickness.

32. The electronic device of claim 24, wherein an effective overall dielectric layer dielectric constant depends upon the ratio of the first thickness and the second thickness and the lanthanide oxide dielectric constant.

* * * * *

UNITED STATES PATENT AND TRADEMARK OFFICE
CERTIFICATE OF CORRECTION

| | | |
|---|---|---|
| PATENT NO. | : 7,511,326 B2 | Page 1 of 1 |
| APPLICATION NO. | : 11/737460 | |
| DATED | : March 31, 2009 | |
| INVENTOR(S) | : Ahn et al. | |

It is certified that error appears in the above-identified patent and that said Letters Patent is hereby corrected as shown below:

On the Title page, in field (56), under "U.S. Patent Documents", in column 1, line 2, delete "Makowshi" and insert -- Makowski --, therefor.

In column 16, line 66, in Claim 12, after "thulium" delete ",".

In column 18, line 4, in Claim 24, after "layers" insert -- of --.

Signed and Sealed this

Seventh Day of July, 2009

JOHN DOLL
*Acting Director of the United States Patent and Trademark Office*